United States Patent
Malitsky et al.

(10) Patent No.: US 6,665,584 B1
(45) Date of Patent: Dec. 16, 2003

(54) MODULE CLASSIFICATION APPROACH FOR MOVING SEMICONDUCTOR WAFERS IN A WAFER PROCESSING SYSTEM

(75) Inventors: Sofya B. Malitsky, Mountain View, CA (US); Stanley P. Liu, Milpitas, CA (US); Janet E. Yi, Campbell, CA (US); Eileen A. H. Wong, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/323,094

(22) Filed: Dec. 18, 2002

Related U.S. Application Data

(62) Division of application No. 09/693,007, filed on Oct. 20, 2000, now Pat. No. 6,560,507.

(51) Int. Cl.[7] ................................................. G06F 7/00
(52) U.S. Cl. ....................................................... 700/218
(58) Field of Search ................................. 700/213, 214, 700/218, 228, 229, 11, 23, 24, 100; 414/800, 935, 939

(56) References Cited

U.S. PATENT DOCUMENTS

| | | | |
|---|---|---|---|
| 5,024,570 A | | 6/1991 | Kiriseko et al. |
| 5,751,580 A | | 5/1998 | Chi |
| 6,122,566 A | | 9/2000 | Nguyen |
| 6,201,998 B1 | | 3/2001 | Lin et al. |
| 6,201,999 B1 | | 3/2001 | Jevtic |
| 6,397,111 B1 | | 5/2002 | Niwa |
| 6,560,507 B1 | * | 5/2003 | Malitsky et al. ............ 700/213 |

* cited by examiner

*Primary Examiner*—Khoi H. Tran
(74) *Attorney, Agent, or Firm*—Okamoto & Benedicto LLP

(57) ABSTRACT

Each module of a wafer processing system is given a classification. Upon receipt of a command to move the wafer to one of the modules, a sequence enumerating the modules to be visited by the wafer before reaching its destination is created. The modules are added to the sequence based on their classification. The wafer is then worked on in each module enumerated in the sequence. By creating the sequence when needed, the number of static files that have to be maintained and stored in the wafer processing system is minimized. Further, creating the sequence at the time it is needed allows the sequence to take advantage of the history of the wafer and thereby eliminate unnecessary steps.

17 Claims, 11 Drawing Sheets

MODULE CLASSIFICATION APPROACH FOR MOVING SEMICONDUCTOR WAFERS IN A WAFER PROCESSING SYSTEM

CROSS-REFERENCE TO RELATED APPLICATION

This application is a divisional of U.S. application Ser. No. 09/693,007, entitled "MODULE CLASSIFICATION APPROACH FOR MOVING SEMICONDUCTOR WAFERS IN A WAFER PROCESSING SYSTEM", filed on Oct. 20, 2000 now U.S. Pat. No. 6,560,507 by Sofya B. Malitsky, Stanley P. Liu, Janet E. Yi, and Eileen A. H. Wong, which is incorporated herein by reference in its entirety.

BACKGROUND OF THE INVENTION

1. Field of the Invention

This invention generally relates to semiconductor wafer processing systems, and more particularly to methods and associated apparatus for transporting and processing semiconductor wafers.

2. Description of the Background Art

Semiconductor devices are fabricated using specialized wafer processing systems, which typically have several modules for performing various operations on a semiconductor wafer. FIG. 1A shows a schematic diagram of an exemplary wafer processing system 100 in the prior art. System 100 has several modules including modules 101–107. System 100 further includes a computer 121 and a data acquisition and control system 122 for controlling various control elements 123 (e.g., valves, relays, robots, gates, sensors, heaters, motors, gas channels etc.) utilized in the modules of system 100. A robot 120 in a transfer module 107 is employed to move wafers from one module to another. The movement and processing of wafers are performed in accordance with a list of steps, commonly referred to as a process recipe, which run on computer 121.

The operation of system 100 is now described using process recipe 108 shown in FIG. 1B as an example. A wafer cassette containing several wafers is loaded in a cassette station module 101. Robot 120 picks up a wafer from the wafer cassette and moves the wafer into aligner module 103 (recipe 108, step 109). In aligner 103, the physical orientation of the wafer is adjusted prior to the wafer's subsequent movement to other modules. Thereafter, the wafer is transferred to a bake station module 104 (recipe 108, step 110), where the wafer is pre-heated prior to being placed in a CVD process module 105. In CVD process module 105, a film of processing material is deposited on the wafer (recipe 108, step 111). System 100 can also accommodate other types of process modules including physical vapor deposition, etching, evaporation, and electro-deposition modules to name a few. Because newly processed wafers can reach temperatures that are high enough to melt a wafer cassette, the wafer coming out of CVD process module 105 is first cooled in a cooling station module 102 (recipe 108, step 112), before it is returned to its wafer cassette. The just described steps are repeated for all wafers in cassette station 101.

Recipe 201 shown in FIG. 2 is similar to recipe 108 except for the use of a parallel step in step 204. A parallel step identifies two or more modules that can be alternatively used. In step 204, the wafer can be processed in either CVD process module 105 or CVD process module 106 whichever is available. As used in this disclosure, the term "module" includes a module identified in a regular step and any one of the modules identified in a parallel step.

Each step in a recipe invokes an associated control program for directing the operation of the listed module. Using recipe 108 as an example, a control program for directing an aligner to adjust the orientation of the wafer is invoked in step 109. As another example, a control program for directing a process module to perform deposition steps on the wafer is invoked in step 111. In wafer processing system 100 shown in FIG. 1A, such control programs run on computer 121, and direct control elements 123 via data acquisition and control system 122. To meet specific process requirements, each control program accepts parameters, such as temperature for the heating elements of bake station 104 or flow rates for the gas channels of CVD process module 105. It is to be noted that control programs, in general, are well known.

In some situations, the processing of wafers in system 100 has to be abruptly terminated. For example, if the computer controlling system 100 encounters an irrecoverable error while running a recipe, all wafers currently in system 100 may have to be recalled back to their cassettes regardless of whether the wafers have been processed in a CVD process module. This allows a maintenance person to troubleshoot system 100 without risk of destroying the wafers. The removal of a wafer from a wafer processing system is also known as a wafer purge.

A wafer reload is the reverse of a wafer purge. During a reload, purged wafers are placed back to their original location prior to the purge to continue their processing. Wafer reload and wafer purge are examples of non-recipe tasks. Non-recipe tasks are run to execute maintenance functions, user requests, and other tasks that do not involve wafer processing in a process module.

Non-recipe tasks have been performed by following a fixed sequence of steps stored as static files. To purge a wafer from bake station 104, for example, purge sequence 113 shown in FIG. 1C is invoked from a static file. In accordance with purge sequence 113, a wafer to be purged from bake station 104 is first cooled in cooling station 102 before being placed in a cassette located in cassette station 101. Purge sequences for other modules of system 100 are also stored as static files. Similarly, static files for wafer reload are available for each module.

The amount of static files that have to be maintained becomes unwieldy as the number of modules supported by system 100 is increased. For example, a patch to fix a common defect will have to be applied to each individual static file containing the purge sequence. Forgetting to apply the patch to even a single static file, which is likely to happen if there are many, can result in the loss of expensive wafers. Further, maintenance personnel will have to familiarize themselves with a large number of static files.

Another problem with static files is that they are inherently inflexible. It is difficult to optimize the sequence contained in static files because the static files are created in advance and are designed to accommodate a variety of situations.

SUMMARY

The present invention relates to a method and associated apparatus for directing the movement of wafers in a wafer processing system.

In one embodiment, each module of the wafer processing system is given a classification. Upon receipt of a request to move the wafer, a sequence enumerating the modules to be visited by the wafer before reaching its destination is created. The modules are added to the sequence based on their classification. The wafer is then worked on in each of the modules enumerated in the sequence.

By creating the sequence when needed, the present invention minimizes the number of static files that have to be maintained and stored in the wafer processing system. Further, creating the sequence at the time it is needed allows the sequence to take advantage of the history of the wafer and thereby eliminate unnecessary steps.

These and other features and advantages of the present invention will be readily apparent to persons of ordinary skill in the art upon reading the entirety of this disclosure, which includes the accompanying drawings.

DETAILED DESCRIPTION

Overview

Figure 1A:
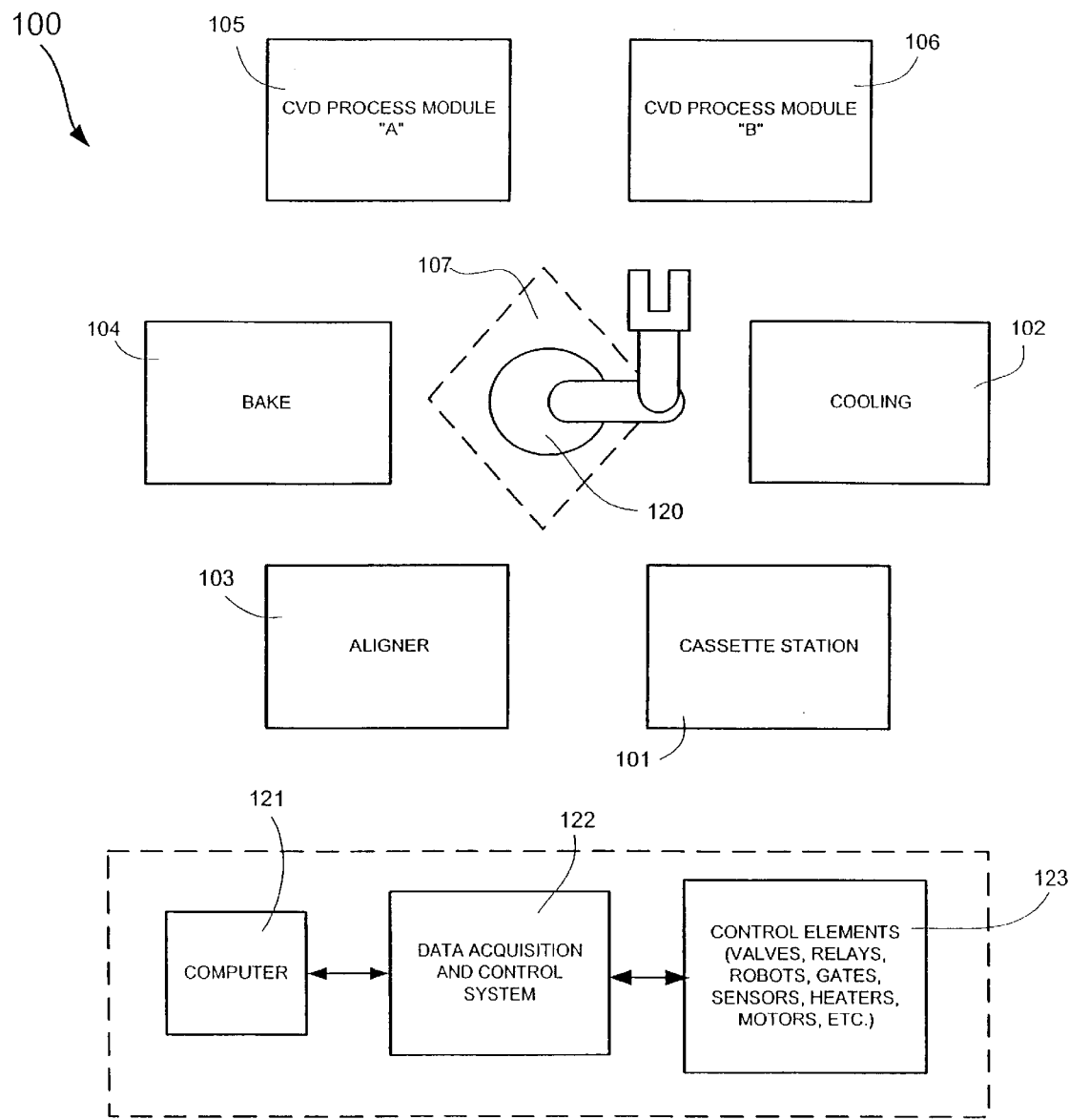
FIG. 1A shows a schematic diagram of a wafer processing system in the prior art.

The present invention relates to a method and associated apparatus for directing the movement of wafers in a wafer processing system. The present invention can be used in a variety of wafer processing systems including, but not limited to, systems for chemical vapor deposition (CVD), physical vapor deposition (PVD), etching, evaporation, and electro-deposition. Further, as can be appreciated by persons of ordinary skill in the art, the invention can be implemented in a variety of ways including as an electronic circuit and/or a program running on a computer. In one embodiment, the invention is used in conjunction with the task scheduler disclosed in the commonly assigned U.S. patent application Ser. No. 09/677,087, entitled "OPERATIONAL LISTS FOR SIMULTANEOUS WAFER SCHEDULING AND SYSTEM EVENT SCHEDULING", filed on Sept. 29, 2000, by Jaideep Jain, Stanley P. Liu, Janet E. Yi, Eileen A. H. Wong, Sofya B. Malitsky, and Thomas Hentschel, which claims priority on U.S. Provisional Application No. 60/157,253 having the same title and inventors. The just mentioned US Patent Application and US Provisional Application are incorporated herein by reference in their entirety.

In accordance with an embodiment of the invention, all locations in a wafer processing system that a wafer can visit are classified according to their function. When a request to move a wafer to a destination location is received, a sequence of steps for directing the movement of the wafer to its destination is created "on the fly". The sequence of steps is based in part on the classification of the locations.

The present disclosure includes flow diagrams which can be implemented as programs running on a computer. For example, each of the flow diagrams can be made into a function, which is called when a sequence needs to be created. The resulting sequence does not have to be archived in the wafer processing system because the sequence can be created by calling the function every time a command to move a wafer is received.

Module Classification

In one embodiment each module of a wafer processing system is classified as either PRE_PROCESSSING, PROCESSING, POST_PROCESSING, WAFER_HANDLING, CASSETTE_HANDLING, or combinations thereof.

Modules for performing pre-processing work on the wafer are classified as PRE_PROCESSING. Using system 100 as an example, aligner 103 and bake station 104 belong to the PRE_PROCESSING class. Generally, modules belonging to the PRE_PROCESSING class are those visited by the wafer before the wafer is placed in a process module.

Modules for performing fabrication steps on the wafer belong to the PROCESSING class. Such modules include CVD process modules 105 and 106. Other examples of modules belonging to the PROCESSING class include modules for physical vapor deposition, etching, evaporation, and electro-deposition.

Modules for performing post-processing work on the wafer are classified as POST_PROCESSING. In system 100, cooling station 102 belongs to the POST_PROCESSING class. Typically, modules belonging to the POST_PROCESSING class are those visited by the wafer after the wafer is processed in a process module.

Modules for manipulating wafers belong to the WAFER_HANDLING class. An example of such a module is transfer module 107, which contains robot 120. Thus, when a wafer is on the arm of robot 120, that wafer is considered to be in a WAFER_HANDLING module. The WAFER_HANDLING class can also include atmospheric robots and wafer carousels.

Modules for manipulating wafer cassettes, such as cassette station 101, are classified as CASSETTE_HANDLING. Other examples of modules belonging to the CASSETTE_HANDLING class include pods, front-end modules, and load locks.

A module can also belong to more than one class. For example, bake station 104 is classified as PRE_PROCESSING and PROCESSING. Bake station 104 is a PRE_PROCESSING module because it pre-heats a wafer before the wafer enters a process module. However, just like a newly processed wafer coming out of a process module, the pre-heated wafer from bake station 104 needs to be cooled in cooling station 102 prior to being placed in its cassette. Thus, bake station 104 is also classified as a PROCESSING module to indicate that wafers coming out of it need to be placed in a POST_PROCESSING module. As is evident from the foregoing, the work performed on the wafer should be considered when classifying modules.

Other classes can also be created to accommodate various wafer processing systems and applications.

Wafer Movement with Recipe

Figure 3A:
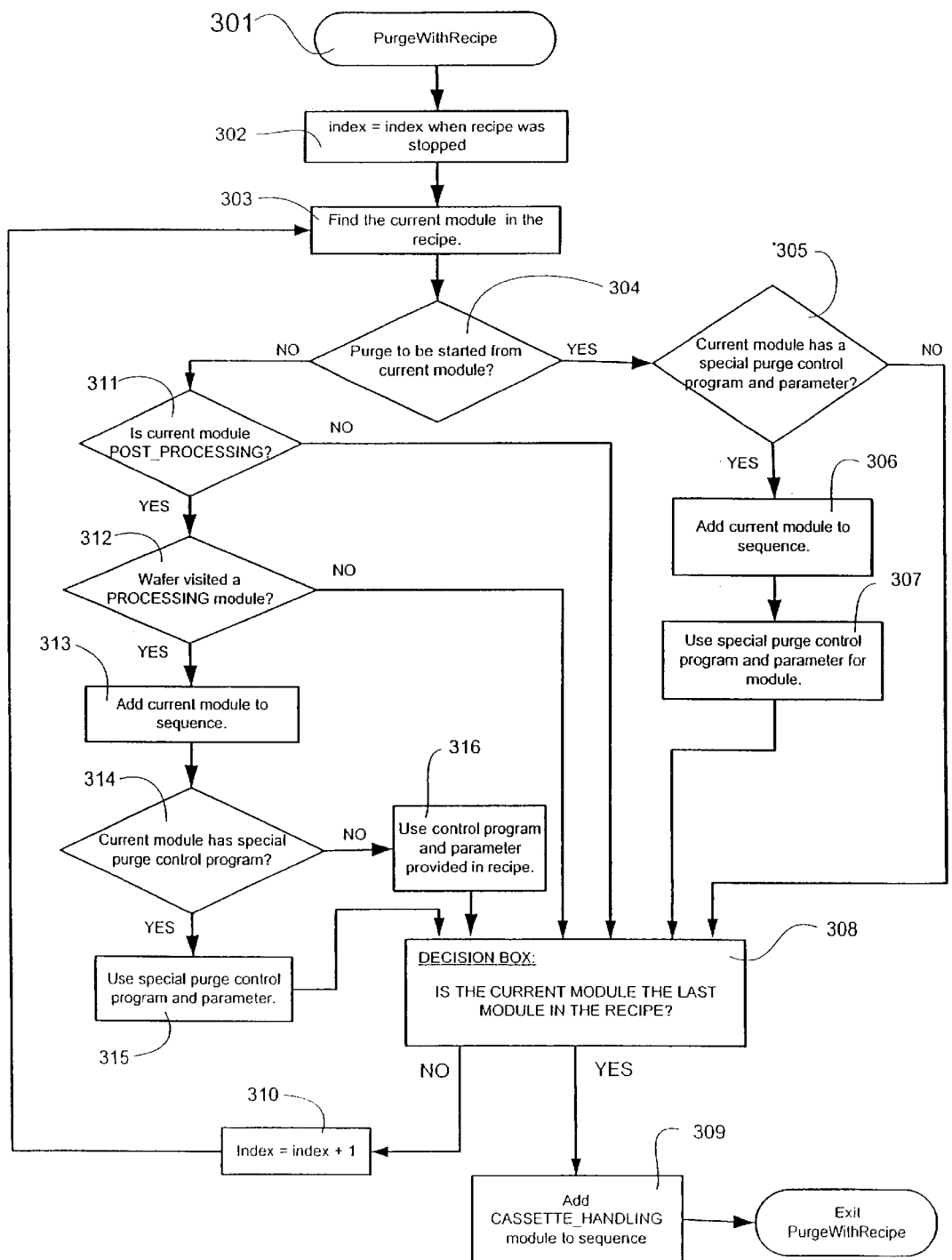
FIG. 3A shows a method for creating a purge sequence in one embodiment of the invention.

The module classifications facilitate the creation of a sequence of steps for moving a wafer from a start location to a destination location, also referred to herein as "start module" and "destination module", respectively. FIG. 3A shows PurgeWithRecipe 301 (hereinafter "method 301"), a method for creating a wafer purge sequence. Method 301 creates a purge sequence for a wafer that has an accompanying process recipe, such as recipe 108 shown in FIG. 1B. When invoked, method 301 creates a purge sequence for each wafer. While method 301 is specifically designed for wafer purging, it can be adapted for use in other non-recipe tasks involving the movement of wafers that have process recipes.

Figure 2:
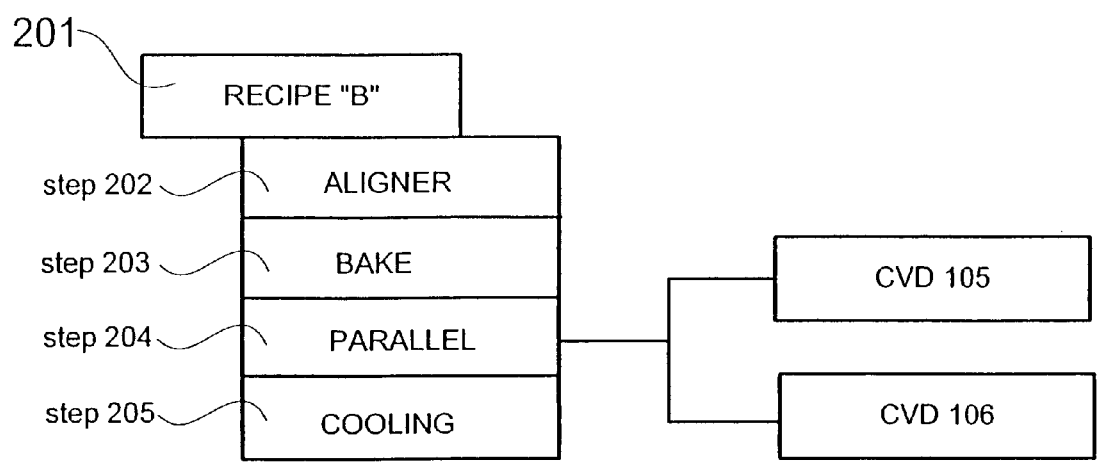
FIG. 2 shows another process recipe in the prior art.

Referring to step 302 of method 301, an index is set to the last step the process recipe was carrying out before the purge. Using recipe 201 shown in FIG. 2 as an example, the index will be set to point to parallel step 204 if the wafer purge command is received while the wafer to be purged is being processed in either CVD process module 105 or CVD process module 106. Continuing in step 303, the current module in the recipe is found by looking up the index. Thus, the current module is either CVD process module 105 or CVD process module 106 if the index is pointing to parallel step 204 of recipe 201.

Figure 3B:
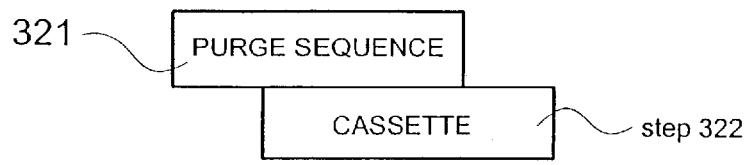
FIGS. 3B, 3C, and 3D show example purge sequences created using the method shown in FIG. 3A.

In step 304, it is determined whether the purge is to be started from the current module. The first time through method 301, the current module is the module from which to start the purge because the index will be pointing to the last step performed by the recipe. Thus, the branch including steps 304 and 305 is taken the first time through method 301. The second and subsequent runs through method 301 will take the branch including steps 304 and 311. In the case where the current module is the module from which to start the purge, it is determined whether the current module has a special control program and parameter set for purge. If not and the current module is the last module in the recipe, a step for a CASSETTE_HANDLING module is added to the purge sequence (steps 305, 308, and 309). An example purge sequence created by going through steps 301–305 and 308–309, in that order, is purge sequence 321 shown in FIG. 3B. Purge sequence 321 is for the case where a wafer using recipe 201 is purged from cooling station 102.

Figure 3C:
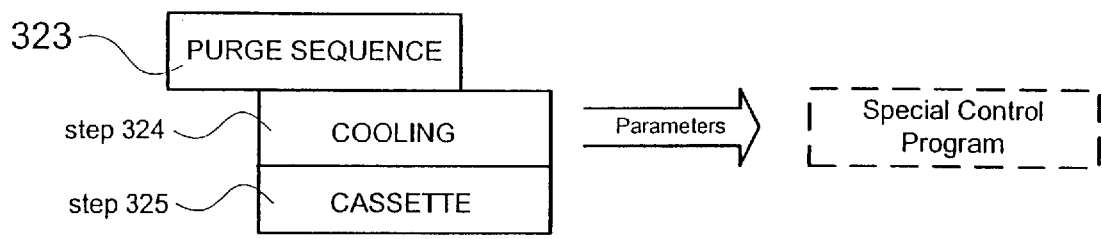

As previously discussed, each step in a recipe has an associated control program for directing the operation of the listed module. In normal operation, both recipe and non-recipe tasks (such as wafer purge, wafer reload, etc.) use the same control program. In this embodiment, an option to utilize a special control program is provided to address unique situations, thus making method 301 more flexible. For example, a process engineer might decide that purging a wafer from a particular module requires a control program and parameter set that are different from that normally used by process recipes. In that case, the engineer can create a special purge control program and parameter set specifically for that module. Accordingly, in step 306, method 301 adds the current module to the purge sequence if the current module has a special control program and parameter set for purge. In the step of the resulting purge sequence, the special control program and its parameter set are conventionally invoked (step 307) by, for example, making a function call or passing a pointer. In step 308, a step for a CASSETTE_HANDLING module is added to the purge sequence if the current module is the last module in the recipe. An example purge sequence created by going through steps 301–309, in that order, is purge sequence 323 shown in FIG. 3C. Purge sequence 323 is for the case where a wafer using recipe 201 is purged from a cooling station 102 that has a special purge control program.

Referring to steps 308 and 310, the index is incremented if the current module is not the last module in the recipe. The index will then be pointing to the next module in the recipe, which is not the module from which to start the purge. Thus, method 301 continues through steps 303, 304, 311, and so on. In step 311, it is determined whether the current module is classified as POST_PROCESSING. If so and the wafer to be purged has been processed in a PROCESSING module, the current module is added to the purge sequence (steps 311–313). Note that the modules already visited by the wafer are conventionally tracked by reading a computer readable storage medium containing operational information for each wafer in the wafer processing system. As is readily apparent from steps 311 and 312, POST_PROCESSING modules are added to the purge sequence only if the wafer has been processed in a process module. This not only improves the efficiency of the wafer processing system by skipping unnecessary modules, but also prevents the wafer from being subjected to extraneous post-processing steps.

Continuing in steps 314 and 315, the current module added to the sequence is assigned a special purge control program and parameter set if available. Otherwise, the control program and parameter set provided in the process recipe are used. The loop including steps 308, 310, 303, and 304 is repeated for all modules in the recipe.

Figure 3D:
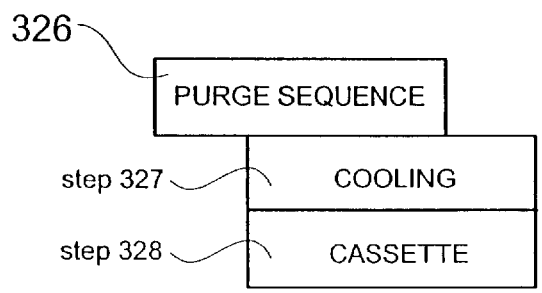

Using method 301 to purge a wafer from bake station 104 results in a purge sequence 326 shown in FIG. 3D. Purge sequence 326 is for the case where the wafer uses recipe 201 shown in FIG. 2, and none of the modules require a special purge control program. Table 1 below traces the steps of method 301 that were executed to create purge sequence 326.

TABLE 1

| Current Module In Recipe Pointed To By The Index | Steps of Method 301 Executed (in order) | Module Added To Purge Sequence 326 |
| --- | --- | --- |
| Bake Station 104 | 301, 302, 303, 304, 305, 308, and 310 | None |
| Parallel (i.e. CVD 105 or CVD 106) | 303, 304, 311, 308, and 310 | None |
| Cooling Station 102 | 303, 304, 311, 312 (note that bake station 104 is also classified as a PROCESSING module), 313, 314, 316, and 308. | Cooling station 104 |
| — | 309 | Cassette Station 101 |

Wafer Movement without Recipe

The present invention can also be used for directing the movement of a wafer (or a wafer-like object) that has no process recipe. This aspect of the invention is useful in situations where a process recipe is not available, does not have the necessary information, or cannot be found due to a system error.

Figure 4A:
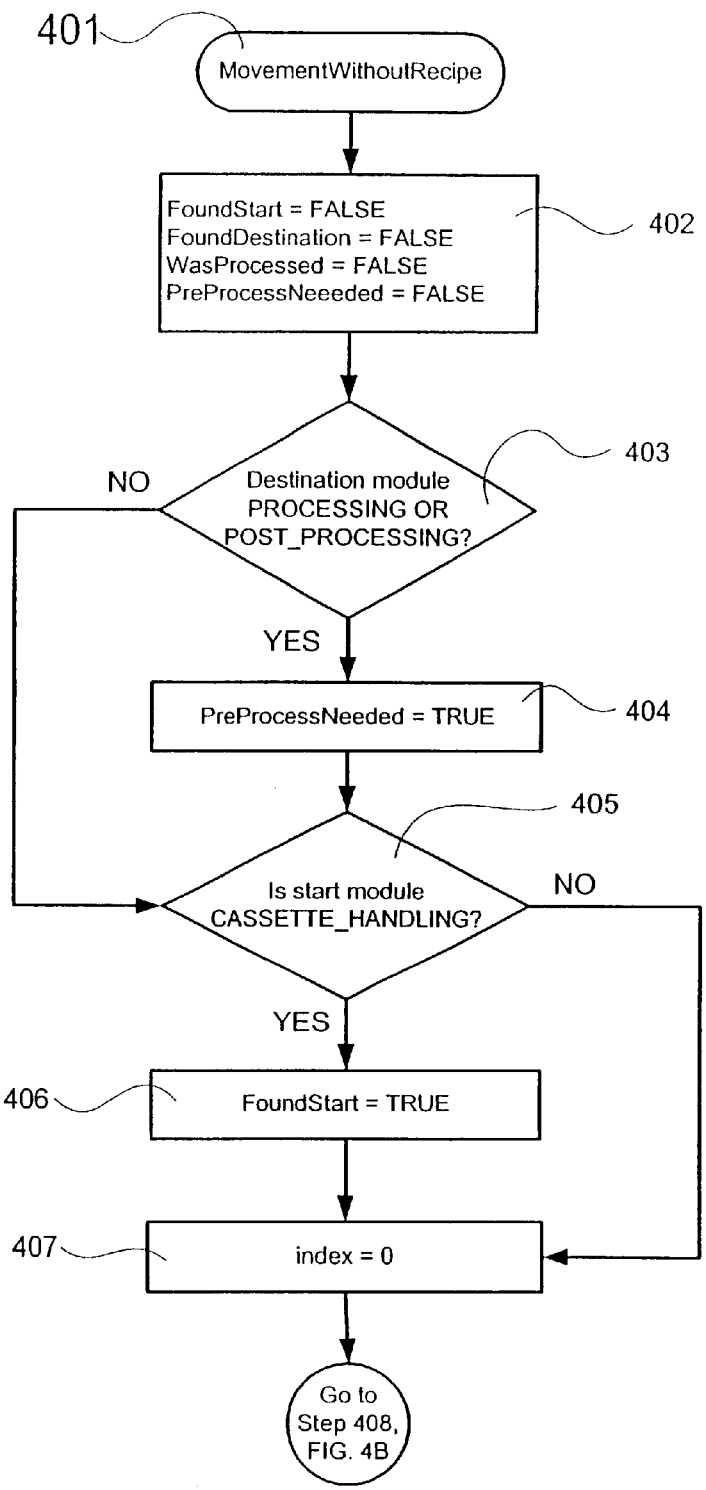
FIGS. 4A and 4B show a method for creating a sequence for moving a wafer that has no process recipe in one embodiment of the invention.

FIG. 4A shows MovementWithoutRecipe 401 (hereinafter "method 401"), a method for creating a sequence for moving a wafer that has no process recipe. When invoked, method 401 creates a sequence for each wafer. Specific tasks for which method 401 is suitable include, without limitation, wafer purging without recipe, "drag and drop", and protective cover movement. Method 401 can also be adapted for other similar tasks.

Wafer purge without recipe, as its name implies, is the removal of a wafer from a wafer processing system without using the wafer's process recipe.

Drag and drop refers to the non-recipe task of moving a wafer from one module to another by simply providing a start module and a destination module. In other words, unlike in a recipe task, the modules between the start and destination modules are not provided. For example, in some wafer processing systems that have a graphical user interface, a user can issue a command to move a wafer from one module to another by clicking on an icon of the wafer shown on a display screen, dragging the icon across the screen, and dropping the icon on a graphical representation of the destination module. The start module is the module where the icon was when it was clicked, while the destination module is the module where the icon was dropped. The other modules that the wafer has to go through, however, cannot be determined from the user's drag and drop actions.

Protective cover movement is a non-recipe task for moving a cover from its storage location in the wafer processing system to a station (e.g., electrostatic chuck) inside a process module, and vice-versa. Typically, the cover is used to protect the station while the process module is being cleaned. Because the cover's storage location and the location of the station are fixed, the start and destination modules for protective cover movement are known in advance. Just like a wafer, the protective cover can be moved about the wafer processing system using the teachings of the present disclosure.

Figure 4B:
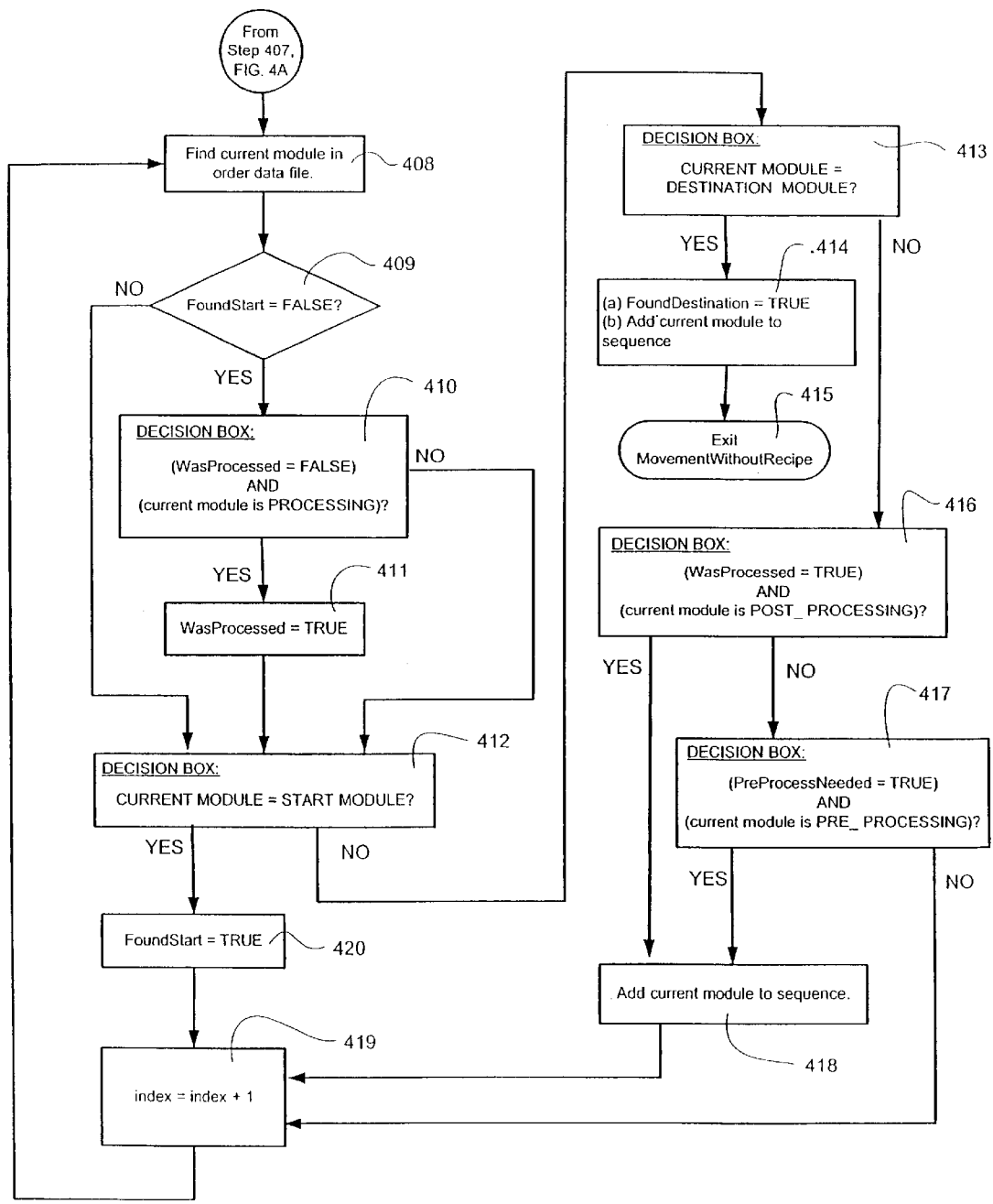
Figure 4C:
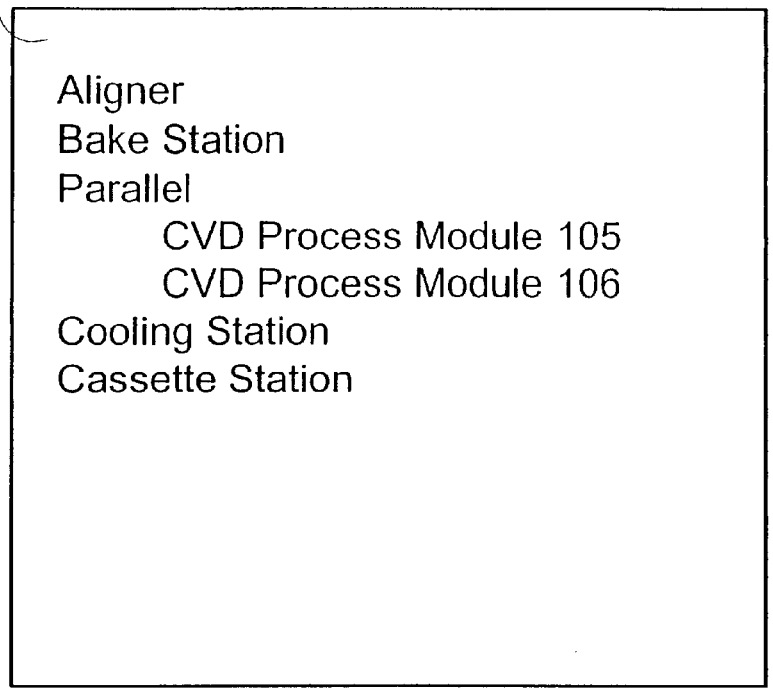
FIG. 4C shows an order file used with the method shown in FIGS. 4A and 4B.

Instead of a process recipe, method 401 uses an "order file" as a guide in creating the sequence. The order file lists all locations of a wafer processing system in the order they are visited by a wafer. Ordinarily, only one order file is required per system. An example order file for system 100 (FIG. 1A) is OrderFile 451 shown in FIG. 4C. As is evident from OrderFile 451, a wafer to be processed in system 100 visits the modules in the following order: (1) aligner; (2) bake station; (3) CVD process module 105 or CVD process module 106; (4) cooling station; and (5) cassette station. Order files for other wafer processing systems can also be similarly created.

Referring to FIG. 4A, method 401 begins by setting the Boolean variables FoundStart, FoundDestination, WasProcessed, and PreProcessNeeded to a logical FALSE (step 402). The aforementioned variables are flags for navigating through the steps of method 401.

In step 403, it is determined whether the destination module is classified as PROCESSING or POST_PROCESSING. If so, the variable PreProcessNeeded is set to TRUE (step 404), indicating that the wafer needs to visit a PRE_PROCESSING module prior to reaching its destination module.

In step 405, it is determined whether the start module is classified as CASETTE_HANDLING. If so, the variable FoundStart is set to TRUE (step 406), indicating that the first module for the sequence being created has been found.

In step 407, an index for keeping track of the modules in the order file is initialized to zero. In step 408 shown in FIG. 4B, the module in the order file currently pointed to by the index (i.e., the current module) is found. Using OrderFile 451 shown in FIG. 4C as an example, an index of "0" corresponds to aligner 103, an index of "1" corresponds to bake station 104, and so on. The steps following step 408 go through each module listed in the order file until all modules to be visited by the wafer in its movement from the start module to the destination module have been identified and enumerated in a sequence.

Continuing in step 409, the value of the variable FoundStart variable is determined. When FoundStart is FALSE, steps 410 and 411 set the variable WasProcessed to TRUE if WasProcessed was FALSE and the current module is a PROCESSING module. Step 411 is not performed if WasProcessed is TRUE in step 410 or if FoundStart is TRUE in step 409.

In step 412, it is determined whether the current module is the start module. If so, the variable FoundStart is set to TRUE and the next module in the order file is selected (steps 420, 419, and 408).

Referring to steps 413–415, the current module is added to the sequence and method 401 is exited If the current module is the destination module. Otherwise, the current module is added to the sequence if the variable WasProcessed is TRUE and the current module is classified as POST_PROCESSING (steps 413, 416, and 418). From step 417, the current module is also added to the sequence if the variable PreProcessNeeded is TRUE and the current module is classified as PRE_PROCESSING (steps 417 and 418).

The loop starting and ending in step 408 is repeated until the destination module is found in the order file. At that time, a sequence enumerating the modules the wafer has to visit to get to the destination module will be completed. It should be noted that each step in the resulting sequence invokes an appropriate control program and parameter set. Thus, if method 401 is used to purge a wafer, each step in the resulting sequence needs to invoke a purge control program and parameter set; if method 401 is used to move a wafer by drag and drop, each step in the resulting sequence needs to invoke a drag and drop control program and parameter set; and so on. The design of such control programs is well within the knowledge of persons of ordinary skill in the art.

Figure 4D:
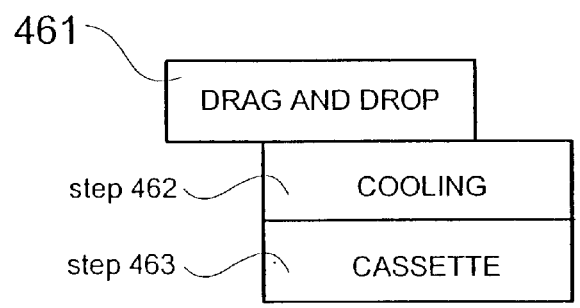
FIG. 4D shows an example drag and drop sequence created using the method shown in FIGS. 4A and 4B.

Using method 401 to drag and drop a wafer from CVD process module 105 (start module) to cassette station 101 (destination module) results in drag and drop sequence 461 shown in FIG. 4D. Sequence 461 was created by indexing through OrderFile 451 shown in FIG. 4C. Table 2 below traces the steps of method 401 that were executed to create sequence 461.

TABLE 2

| Current Module In Order File Pointed To By The Index | Steps of Method 401 Executed (in order) | Module Added To Drag and Drop Sequence 461 |
| --- | --- | --- |
| — | 402, 403, 405, and 407 | None |
| Aligner 103 | 408, 409, 410, 412, 413, 416, 417, and 419 | None |
| Bake Station 104 | 408, 409, 410, 412, 413, 416, 417, and 419 | None |
| Parallel Cooling Station 102 | 408, 409, 410, 411, 412, 420, and 419 | None |
|  | 408, 409, 412, 413, 416, 418, and 419 | Cooling Station 102 |
| Cassette Station 101 | 408, 409, 412, 413, 414, and 415 | Cassette Station 101 |

Wafer Reload

Figure 5A:
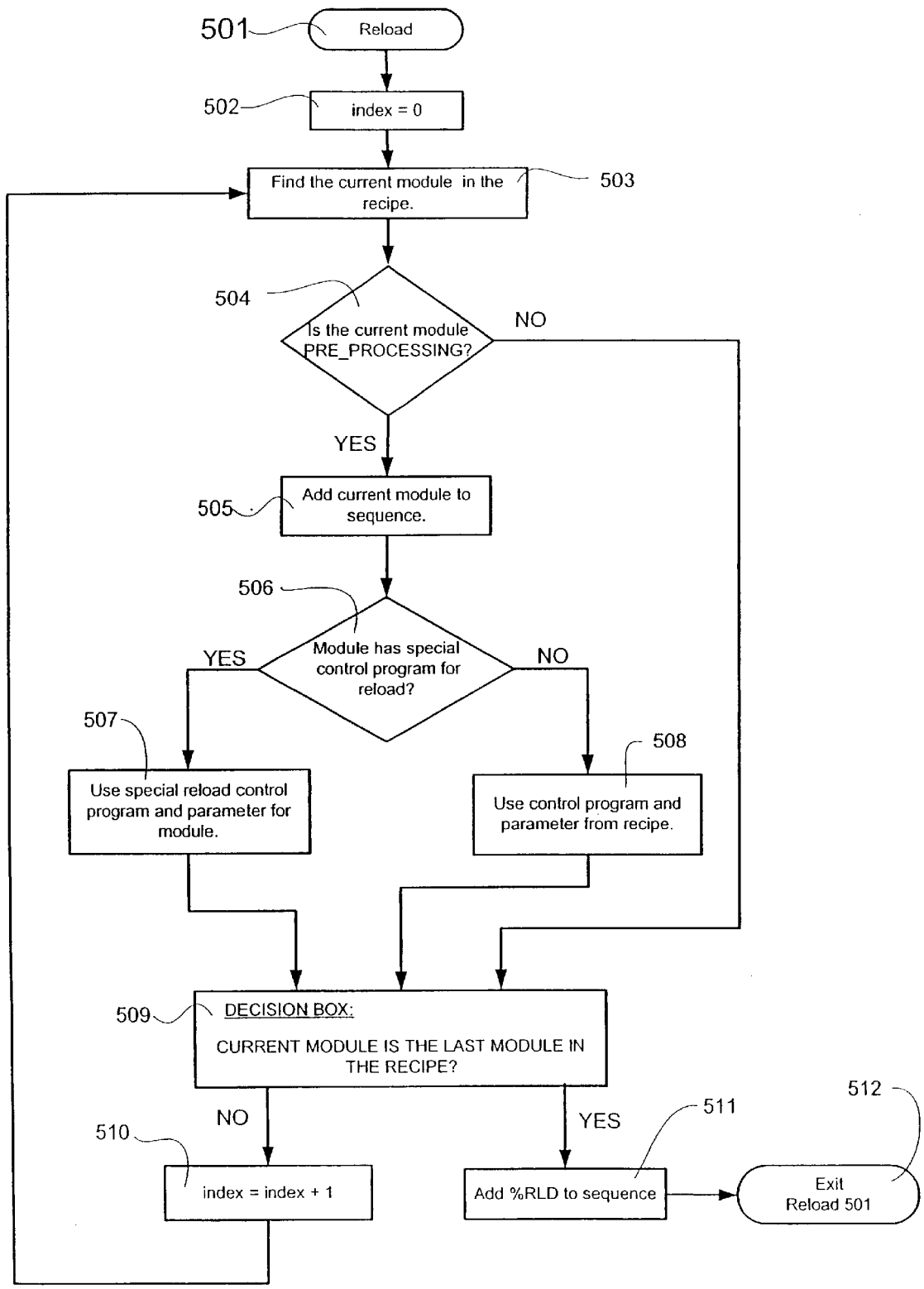
FIG. 5A shows a method for creating a reload sequence in one embodiment of the invention.

FIG. 5A shows Reload 501 (hereinafter "method 501"), a method for creating a reload sequence. Method 501 is used in conjunction with the wafers' process recipe. When invoked, method 501 creates a reload sequence which can be used for all wafers sharing the same recipe.

Typically, a cassette station or similar CASSETTE_HANDLING module is the start module in a wafer reload. The destination module is either provided by the user or read from a computer readable storage medium where information about the wafer was saved when the wafer was purged from the wafer processing system. Given the start and destination modules, method 501 creates a sequence enumerating all modules the wafer has to visit to reach the destination module.

Referring to step 502, an index for keeping track of modules in the process recipe is initialized to zero. In step 503, the module in the process recipe currently pointed to by the index (i.e., the current module) is found. Using process recipe 108 shown in FIG. 1B as an example, an index of "0" corresponds to aligner 103, an index of "1" corresponds to bake station 103, and so on.

The current module is added to the sequence if it is a PRE_PROCESSING module (steps 504 and 505). Further, if the module has a special control program for wafer reload, that control program and associated parameter set are used for the module (steps 506 and 507). Otherwise, the control program and parameter set provided in the process recipe are used (step 508). The loop including steps 509, 510, and 503 is repeated for each module in the recipe. When the last module in the recipe has been indexed, a variable "%RLD" is added to the sequence and method 501 is exited (steps 509, 511, and 512). The variable %RLD is a placeholder for the destination module. For example, %RLD equals CVD process module 105 if CVD process module 105 is the destination module.

Figure 1B:
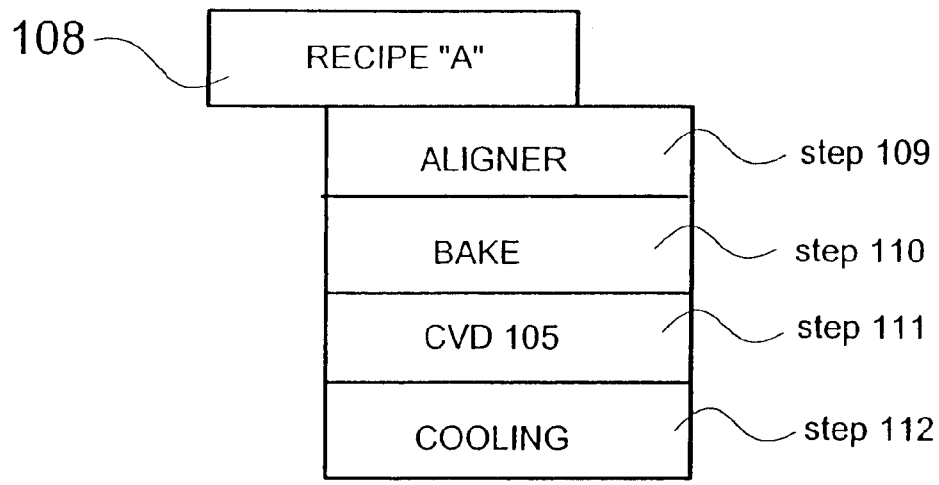
FIG. 1B shows a process recipe in the prior art.
Figure 1C:
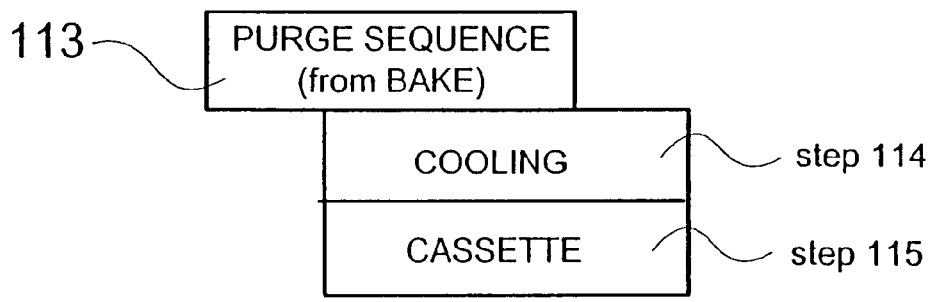
FIG. 1C shows a purge sequence created using a method in the prior art.
Figure 5B:
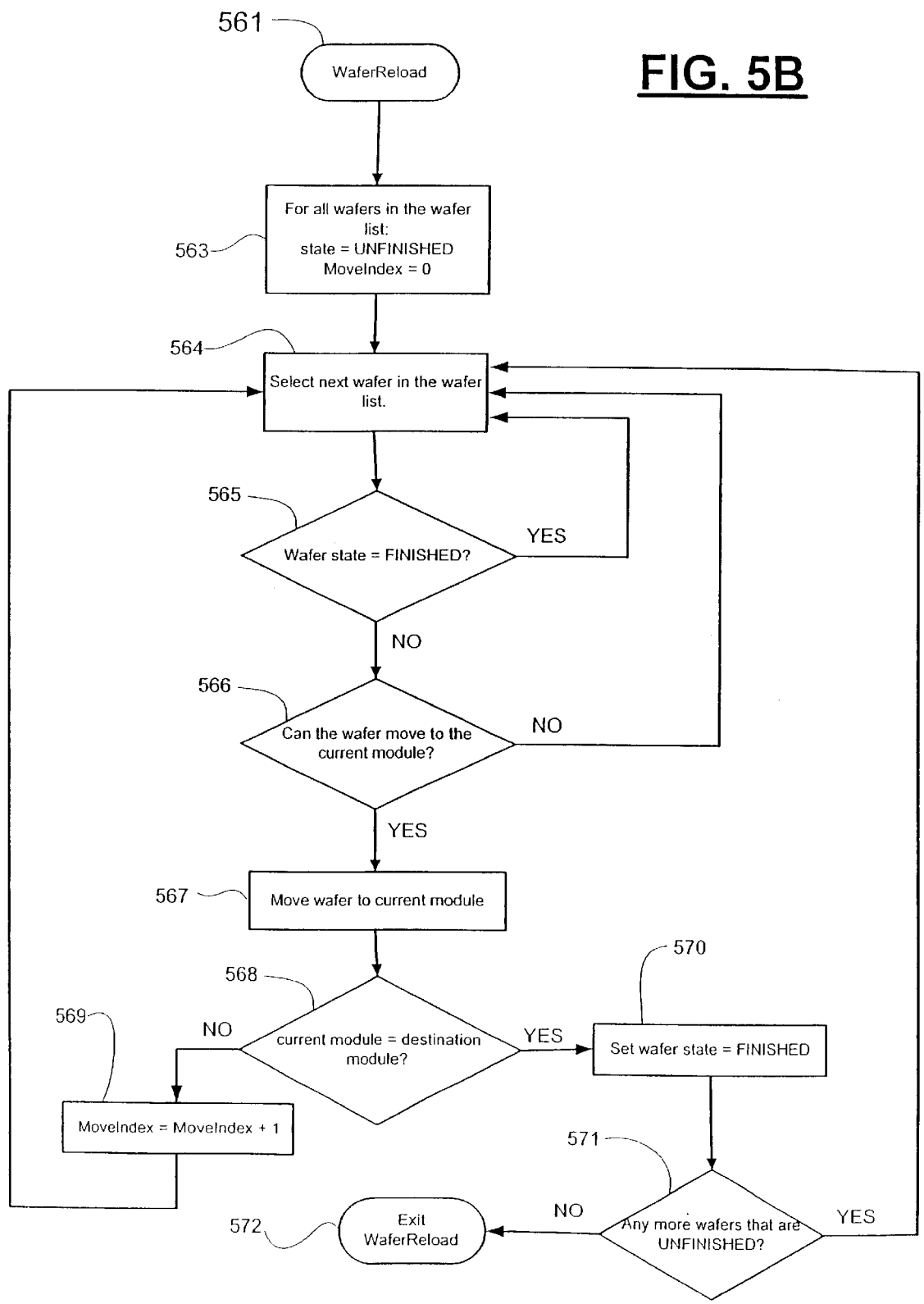
FIG. 5B shows a method for reloading wafers enumerated in a wafer list in one embodiment of the invention.
Figure 5C:
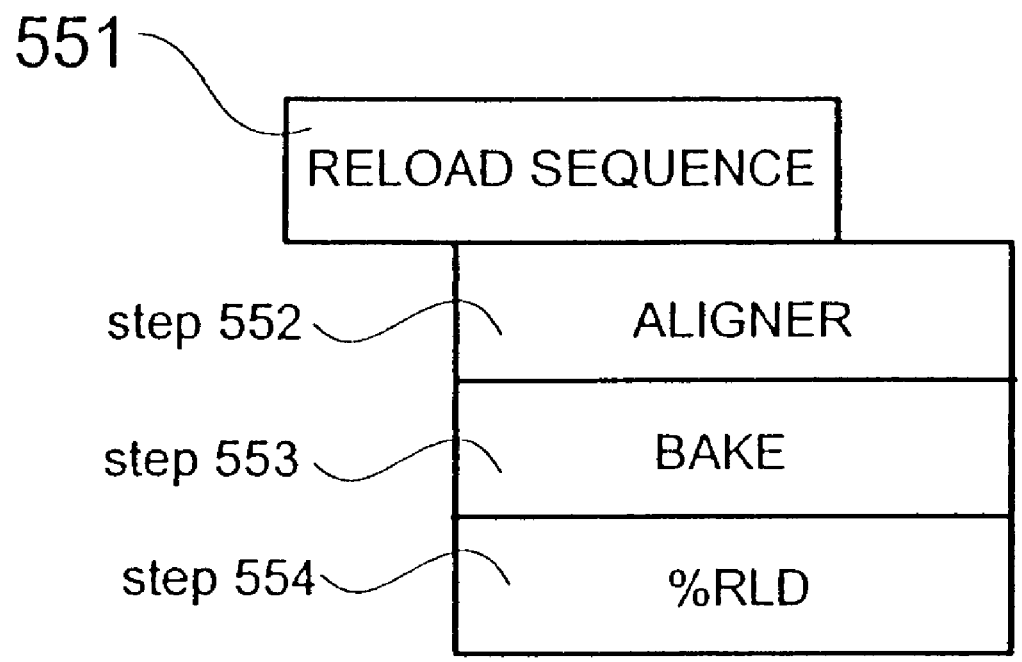
FIG. 5C shows an example reload sequence created using the method shown in FIG. 5A.

Using method 501 in conjunction with recipe 108 shown in FIG. 1B results in a reload sequence 551 shown in FIG. 5C. Reload sequence 551 is for the case where each wafer uses recipe 108, and none of the modules listed in the recipe require a special reload control program. Table 3 below traces the steps of method 501 that were executed to create sequence 551.

TABLE 3

| Current Module In Recipe Pointed To By The Index | Steps of Method 501 Executed (in order) | Module Added To Reload Sequence 551 |
| --- | --- | --- |
| — | 501 and 502 | None |
| Aligner 103 | 503, 504, 505, 506, 508, 509, and 510 | Aligner 103 |
| Bake Station 104 | 503, 504, 505, 506, 508, 509, and 510 | Bake Station 104 |
| CVD 105 | 503, 504, 509, and 510 | None |
| Cooling Station 102 | 503, 504, 509, 511, and 512 | % RLD |

Once a reload sequence is created for a particular recipe, each wafer using that recipe is enumerated in a wafer list. The wafers are ordered in the wafer list such that wafers with the farthest destination modules are reloaded first. Using system 100 as an example, wafers destined for CVD process module 105 are reloaded before wafers destined for aligner 103, wafers destined for aligner 103 are reloaded before a wafer destined for the arm of robot 120, etc. This prevents a reloaded wafer from getting in the way of wafers yet to be reloaded.

FIG. 5B shows WaferReload 561 (hereinafter "method 561"), a method for reloading wafers enumerated in a wafer list. The wafer list contains all purged wafers that require further processing. One way of creating the wafer list is to determine where in the recipe a wafer is before that wafer is purged. Wafers that have not completed all the steps of their respective process recipes are marked and added to the wafer list for reloading at a later time.

Method 561 uses the reload sequence created by method 501 to direct the wafers to their respective destination modules. In one embodiment, each wafer in the wafer list has a MoveIndex for keeping track of the wafer as it visits the modules enumerated in the reload sequence. Using reload sequence 551 as an example, a MoveIndex of "0" corresponds to aligner 103, a MoveIndex of "1" corresponds to bake station 104, and so on. Wafers that have been reloaded to their respective destination modules are placed in the finished state while those that have not are in the unfinished state.

Referring to step 563, all wafers in the wafer list are placed in the unfinished state. Also in step 563, the MoveIndex of each wafer in the wafer list is set to zero. In step 564, a wafer in the wafer list is selected. Another wafer is selected If the wafer is in the finished state (steps 565 and 564). If the currently selected wafer cannot be moved (e.g., blocked by another wafer or a failed module), the next wafer in the wafer list is selected (steps 566 and 564). Otherwise, the wafer is moved to the module in the reload sequence corresponding to the wafer's MoveIndex (steps 566 and 567).

In steps 568 and 569, the wafer's MoveIndex is incremented if the MoveIndex does not correspond to the wafer's destination module. Thereafter, another wafer in the wafer list is selected (steps 569 and 564). This gives another wafer the opportunity to move while the previously selected wafer is moving to a module. Because the previously selected wafer remains in the unfinished state, it will be reselected and moved again at a later time.

If the wafer's MoveIndex corresponds to the wafer's destination location, the wafer is placed in the finished state (steps 568 and 570). The loop starting in step 564 is then repeated for all wafers in the wafer list that remain in the unfinished state (steps 571 and 564). Method 561 is exited when all wafers in the wafer list have been reloaded to their respective destination modules (i.e., no more unfinished wafers).

As previously pointed out, other module classifications can also be created to address specific situations. In one embodiment, a module that cannot be reloaded into is classified as a RELOAD_TO_NEXT_LOC module. When a wafer is to be reloaded into such a module, the wafer is instead reloaded to the next module enumerated in the process recipe. In another embodiment, a robot arm that can place and get a wafer from an aligner is classified as a TWO_DIR_TO_PREPROC module. In reloading to the robot arm, the wafer will first visit the aligner only if the wafer has already done so before it was purged. For the just mentioned embodiments, methods 501 and 561 are modified to detect the additional classifications and respond accordingly.

Conclusion

A technique for directing the movement of a wafer in a wafer processing system has been disclosed. While specific embodiments have been discussed, it is to be understood that these embodiments are provided for illustration purposes and not limiting. Many other embodiments in accordance with the teachings of this disclosure will be readily apparent to persons of ordinary skill in the art.

What is claimed is:

1. A method for moving a wafer in a wafer processing system comprising:

providing a list containing all locations to be visited by a wafer in a wafer processing system;

classifying the locations contained in said list;

creating a sequence upon receipt of a command to move the wafer to a destination location;

determining the classification of each location contained in said list; and adding at least one location contained in said list to said sequence based on the respective classification of the locations contained in said list.

2. The method of claim 1 wherein said list is a process recipe.

3. The method of claim 1 wherein said list is an order file.

4. The method of claim 1 wherein the locations contained in said list are modules of said wafer processing system.

5. The method of claim 1 wherein said command to move the wafer is for a wafer purge.

6. The method of claim 1 wherein said command to move the wafer is for a drag and drop.

7. The method of claim 1 wherein said command to move the wafer is for a wafer reload.

8. A method of directing movement of a wafer in a wafer processing system, the method comprising:

creating on the fly a sequence of steps for moving a wafer from a start location to a destination location; and moving the wafer to at least one location in the sequence of steps.

9. The method of claim 8 wherein the wafer has no corresponding process recipe.

10. The method of claim 8 wherein the sequence of steps comprises a wafer purge sequence.

11. The method of claim 8 wherein the sequence of steps comprises a drag and drop sequence.

12. The method of claim 8 wherein the sequence of steps comprises a protective cover movement sequence.

13. The method of claim 8 wherein the sequence of steps is based in part on a classification of locations in the wafer processing system.

14. A wafer processing system comprising:

a plurality of locations; and a computer configured to create on the fly a sequence of steps for moving a wafer from a start location to a destination location.

15. The system of claim 14 wherein the plurality of locations include a process module.

16. The system of claim 14 wherein the wafer has no corresponding process recipe.

17. The system of claim 14 wherein the sequence of steps is based in part on a classification of locations in the wafer processing system.

* * * * *